United States Patent
Bhattacharjee et al.

(10) Patent No.: US 7,408,286 B1
(45) Date of Patent: Aug. 5, 2008

(54) PIEZOELECTRIC SUBSTRATE FOR A SAW DEVICE

(75) Inventors: Kushal Bhattacharjee, Kernersville, NC (US); Sergei Zhgoon, Moscow (RU)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 11/623,939

(22) Filed: Jan. 17, 2007

(51) Int. Cl.
*H01L 41/08* (2006.01)

(52) U.S. Cl. .................. 310/316; 310/313 R
(58) Field of Classification Search .......... 310/346
See application file for complete search history.

(56) References Cited

U.S. PATENT DOCUMENTS

| | | | |
|---|---|---|---|
| 6,313,568 B1 * | 11/2001 | Sullivan et al. | 310/346 |
| 6,420,820 B1 * | 7/2002 | Larson, III | 310/346 |
| 6,441,539 B1 * | 8/2002 | Kitamura et al. | 310/346 |
| 7,126,259 B2 * | 10/2006 | Moler et al. | 310/346 |
| 2006/0186556 A1 * | 8/2006 | Sung | 257/798 |
| 2007/0296306 A1 * | 12/2007 | Hauser et al. | 310/313 R |

* cited by examiner

*Primary Examiner*—Thomas M Dougherty
(74) *Attorney, Agent, or Firm*—Winthrop & Terranova, PLLC

(57) ABSTRACT

The present invention provides a composite structure having a supporting substrate between a piezoelectric substrate and a compensation layer. The materials used to form the piezoelectric substrate and the compensation layer in isolation, have higher thermal coefficients of expansion (TCE) relative to the TCE of the materials forming the supporting substrate. Once the composite structure is created, the piezoelectric substrate and compensation layer tend to expand and contract in a similar manner as temperature changes. The expansion and contraction forces applied to the supporting substrate by the piezoelectric substrate due to temperature changes are substantially countered by similar opposing forces applied by the compensation layer, resulting in the opposing forces substantially counteracting one another. Due to the counteraction, the composite structure resists bending or warping, reducing expansion and contraction and increasing stress of the piezoelectric substrate, and thus reducing the effective TCE and TCF of the piezoelectric substrate.

14 Claims, 7 Drawing Sheets

PIEZOELECTRIC SUBSTRATE FOR A SAW DEVICE

FIELD OF THE INVENTION

The present invention relates to a Surface Acoustic Wave (SAW) device, and more particularly to a SAW device formed on an improved piezoelectric substrate.

BACKGROUND OF THE INVENTION

Surface acoustic wave (SAW) devices use one or more interdigitated transducers (IDTs), and perhaps reflectors, provided on a piezoelectric substrate to convert acoustic waves to electrical signals and vice versa. SAW devices are often used in filtering applications for high-frequency signals. Of particular benefit is the ability to create low loss high order bandpass and notch filters without employing complex electrical filter circuits, which may require numerous active and passive components. A common location for a filtering application is in the transceiver circuitry of wireless communication devices.

With reference to FIG. 1, a typical SAW device 10 on a temperature compensated bonded substrate is illustrated. The SAW device 10 will generally only include a piezoelectric substrate 12, which has a surface on which various types of SAW elements, such as IDTs and reflectors, may be formed. In a temperature compensated bonded substrate, the piezoelectric substrate 12 resides on a supporting substrate 14 as shown in FIG. 1. The mechanical and thermal properties of the supporting substrate 14 and the piezoelectric substrate 12 act in conjunction to render the SAW device 10 more stable to temperature variations. As illustrated in this example, a dual-mode SAW (DMS) device is provided, wherein at least two interdigitated transducers (IDT) 16 are placed between two interdigitated reflectors 18. Both the IDTs 16 and the reflectors 18 include a number of fingers 20 that are connected to opposing bus bars 22. For the reflectors 18, all of the fingers 20 connect to each bus bar 22. For the IDTs 16, alternating fingers 20 are connected to different bus bars 22, as depicted. Notably, the reflectors 18 and IDTs 16 generally have a much larger number of fingers 20 than depicted. The number of actual fingers 20 has been significantly reduced in the drawing figures in an effort to more clearly depict the overall concepts employed in available SAW devices 10 as well as the concepts provided by the present invention.

Notably, the fingers 20 are parallel to one another and aligned within an acoustic cavity, which essentially encompasses the area in which the reflectors 18 and the IDTs 16 reside. In this acoustic cavity, the standing wave or waves generated when the IDTs 16 are excited with electrical signals essentially reside within the acoustic cavity. As such, the acoustic wave energy essentially runs perpendicular across the various fingers 20. In the example illustrated in FIG. 1, one IDT 16 may act as an input while the other IDT 16 may act as an output for electrical signals. Notably, the IDTs 16 and the reflectors 18 are oriented in acoustic series, such that the acoustic wave energy moves along the cavity and perpendicularly across the respective fingers 20 of the IDTs 16 and the reflectors 18.

The operating frequency of the SAW device 10 is a function of the pitch (P). The pitch is the spacing between the interdigitated fingers 20 of the IDTs 16 and reflectors 18. An objective of most SAW designs is to maintain a consistent frequency response of the SAW device 10. If the spacing changes between the interdigitated fingers 20, the frequency response of the SAW device 10 changes. However, the spacing changes are only a part of the response change. Another factor that significantly affects the frequency response change in the SAW device 10 is the change in SAW velocity which occurs in response to the change in elastic properties of the piezoelectric substrate 12. Unfortunately, piezoelectric substrates 12 generally have a relatively high thermal coefficient of expansion (TCE) and a significant dependence on the temperature coefficient of velocity (TCV), and as temperature changes, the piezoelectric substrate 12 will expand and contract and the velocity will increase and decrease. Such expansion and contraction changes the pitch, or spacing, between the interdigitated fingers 20 as the velocity changes, with temperature variations, in an unfavorable way. Expansion and contraction of the piezoelectric substrate 12, along with an increase and decrease of SAW velocity changes the frequency response of the SAW device 10. The thermal coefficient of frequency (TCF=TCV−TCE) is a measure of how much the frequency response changes as a function of temperature. Given the need for a SAW device 10 having a frequency response that is relatively constant as temperature changes, there is a need for a piezoelectric substrate 12 that has an effective TCF that is relatively low. To obtain a low TCF, the piezoelectric substrate 12 needs to have a relatively low difference between the effective TCE and the effective TCV. This condition may coincide with simultaneously low TCE and TCV to limit expansion and contraction of the piezoelectric substrate 12 as temperature changes.

A piezoelectric substrate 12 having a higher TCE also injects issues during manufacturing of the SAW device 10. As noted, the piezoelectric substrate 12 is formed on a supporting substrate 14. The supporting substrate 14 generally has a significantly lower TCE than the piezoelectric substrate 12 and thus will not expand or contract as much as the piezoelectric substrate 12 as temperature changes. As such, the change in velocity is minimal for the supporting substrate 14 as temperature changes. As temperature changes during the manufacturing process, the piezoelectric substrate 12 tends to expand and contract more than the supporting substrate 14, which results in bending or warping of both the supporting substrate 14 and the piezoelectric substrate 12, as shown in FIGS. 2A and 2B. Bent and warped substrates lead to a litany of manufacturing issues during photolithography, dicing, mounting, packaging, and integration of the SAW devices 10 with other semiconductor components. Accordingly, there is a further need for a SAW device 10 with an effective TCE that is relatively low.

SUMMARY OF THE INVENTION

The present invention provides a composite structure having a supporting substrate between a piezoelectric substrate and a compensation layer. The materials used to form the piezoelectric substrate and the compensation layer in isolation have higher thermal coefficients of expansion (TCE) relative to the TCE of the materials forming the supporting substrate. Once the piezoelectric structure is created, the piezoelectric substrate and the compensation layer tend to expand and contract in a similar manner as temperature changes. As such, the expansion and contraction forces applied to the supporting substrate by the piezoelectric substrate due to temperature changes are substantially countered by opposing forces applied by the compensation layer. Since the expansion or contraction forces on opposing faces of the supporting substrate, applied to the supporting substrate by the piezoelectric substrate and the compensation layer are similar, and thus counter one another, the composite structure resists bending or warping as temperature changes. Reducing bending and warping reduces expansion and contraction of the piezoelectric substrate, and thus the effective TCE of the piezoelectric substrate. Preferably, the supporting substrate has a relatively high Young's Modulus to provide sufficient rigidity to withstand the forces applied by the piezoelectric substrate and the compensation layer, and thus further reduces expansion and contraction of the piezoelectric substrate.

Since providing the compensation layer on the opposite side of the supporting substrate reduces the effective TCE of the piezoelectric substrate, the amount of expansion and contraction along the surface of the piezoelectric substrate as temperature changes is reduced. Therefore, the change in spacing, or pitch, between the interdigitated fingers of the IDTs and the reflectors as temperature changes is reduced. Reducing the change in spacing between the interdigitated fingers reduces the effective thermal coefficient of frequency (TCF) of the piezoelectric substrate to improve overall frequency response of the IDTs and the reflectors, and thus the SAW device, as temperature changes. At the same time, the amount of stress in the region of ultrasonic propagation on the surface of the piezoelectric substrate is increased leading to a stronger change in elastic properties, and thus, leading to favorable changes in ultrasonic velocity. Applying larger stress to the piezoelectric substrate leads to improvement of the TCV to further improve the overall frequency response of the IDTs and the reflectors, and thus the SAW device, as temperature changes.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
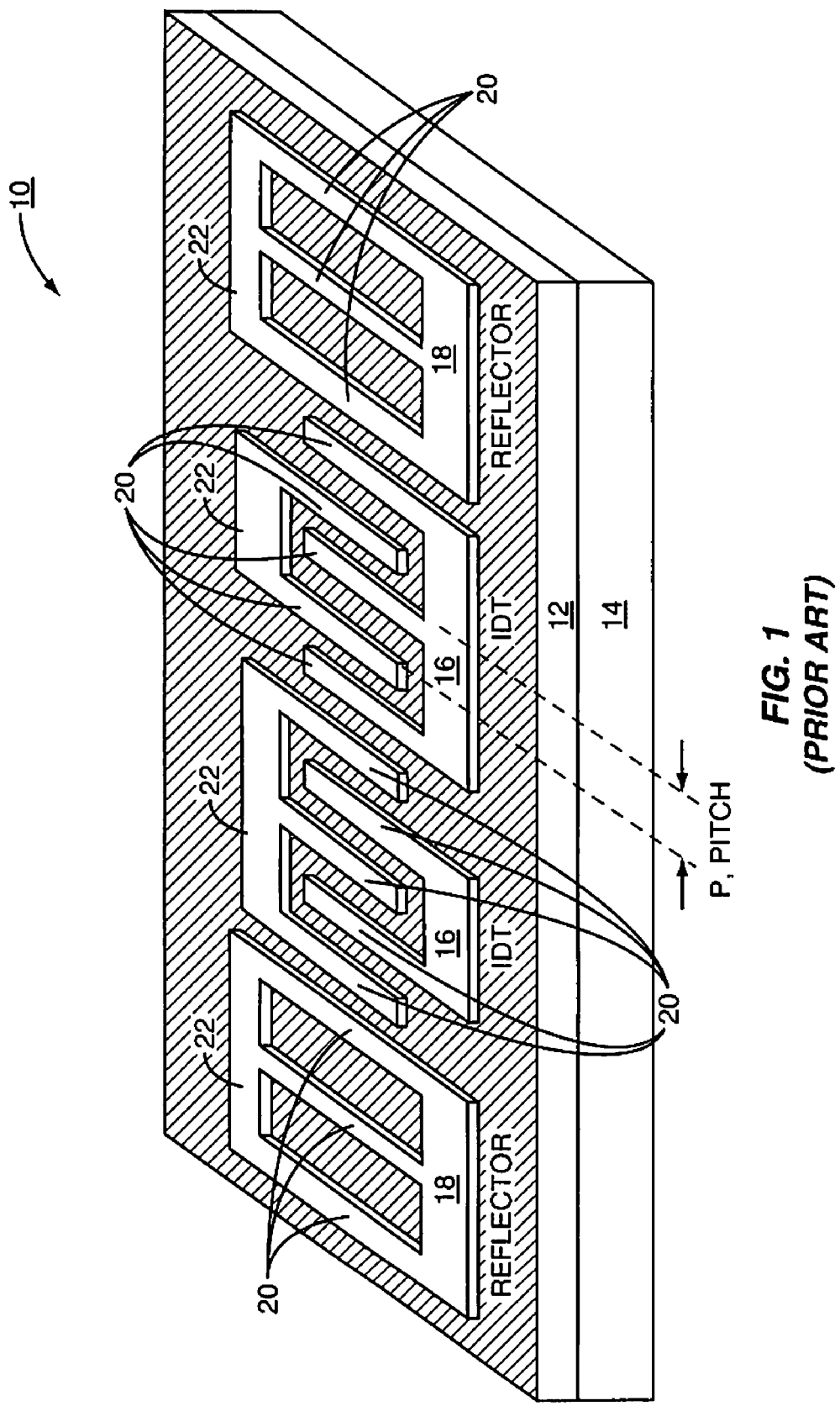
FIG. 1 depicts a perspective view of a SAW device according to the prior art.
Figure 2A:
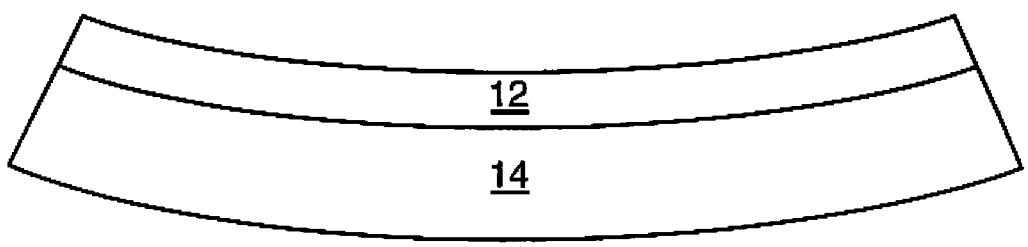
FIGS. 2A and 2B depict a cross sectional view of the bending and warping of the piezoelectric substrate and the supporting substrate during expansion and contraction.
Figure 2B:
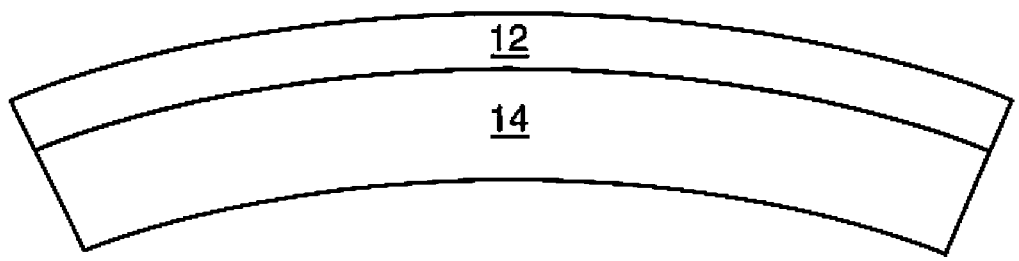
Figure 3:
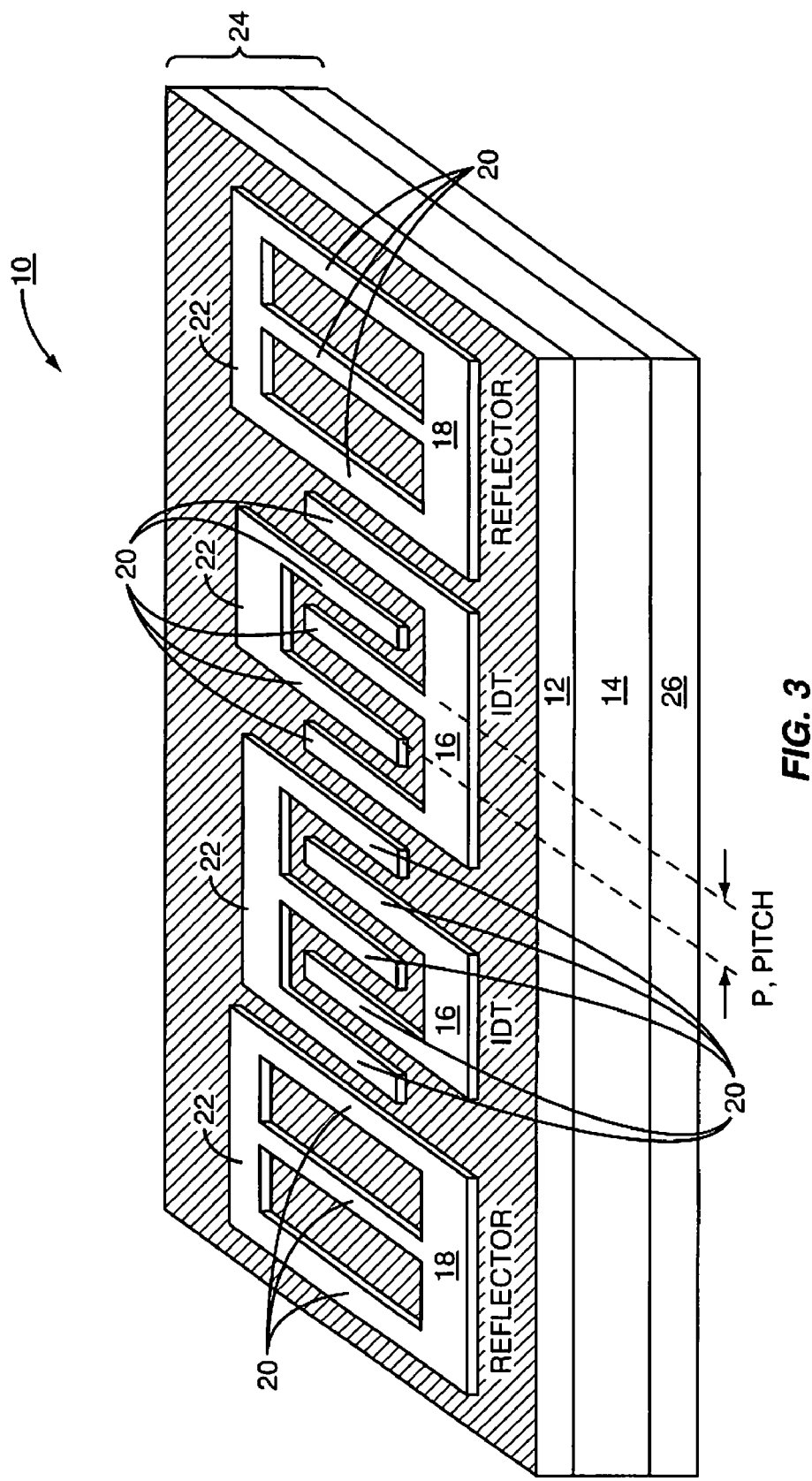
FIG. 3 depicts a perspective view of a SAW device according to the present invention.

With reference to FIG. 3, a SAW device 10 is illustrated according to one embodiment of the present invention. The SAW device 10 will generally include a piezoelectric substrate 12, which has a surface on which various types of SAW elements, such as IDTs and reflectors, may be formed. The piezoelectric substrate 12 resides on a supporting substrate 14. As illustrated in this example, a dual-mode SAW (DMS) device is provided, wherein at least two interdigitated transducers (IDT) 16 are placed between two interdigitated reflectors 18. Both the IDTs 16 and the reflectors 18 include a number of fingers 20 that are connected to opposing bus bars 22. For the reflectors 18, all of the fingers 20 connect to each bus bar 22. For the IDTs 16, alternating fingers 20 are connected to different bus bars 22, as depicted. Notably, the reflectors 18 and IDTs 16 generally have a much larger number of fingers 20 than depicted. The number of actual fingers 20 has been significantly reduced in the drawing figures in an effort to more clearly depict the overall concepts employed in available SAW devices 10 as well as the concepts provided by the present invention.

The present invention provides a composite structure 24 having a supporting substrate 14 between the piezoelectric substrate 12 and a compensation layer 26. The materials used to form the piezoelectric substrate 12 and the compensation layer 26 in isolation have relatively high thermal coefficients of expansion (TCE) relative to the TCE of the materials forming the supporting substrate 14. Once the composite structure 24 is created, the piezoelectric substrate 12 and the compensation layer 26 tend to expand and contract in a similar manner as temperature changes. As such, the expansion and contraction forces applied to the supporting substrate 14 by the piezoelectric substrate 12 due to temperature changes are substantially countered by opposing forces applied by the compensation layer 26. Since the expansion and contraction forces applied to the supporting substrate 14 by the piezoelectric substrate 12 and the compensation layer 26 substantially counter or mirror one another, the composite structure 24 resists bending or warping as temperature changes. Reducing bending and warping reduces expansion and contraction of the piezoelectric substrate 12, and thus, the effective TCE of the piezoelectric substrate 12. Preferably, the supporting substrate 14 has a relatively high Young's Modulus to provide sufficient rigidity to withstand the forces applied by the piezoelectric substrate 12 and the compensation layer 26, and thus, further reduce expansion and contraction of the piezoelectric substrate 12.

Since providing the compensation layer 26 on the opposite side of the supporting substrate 14 reduces the effective TCE of the piezoelectric substrate 12, the amount of expansion and contraction along the surface of the piezoelectric substrate 12 as temperature changes is reduced. Therefore, the change in spacing, or pitch, between the interdigitated fingers 20 of the IDTs 16 and the reflectors 18 as temperature changes is reduced. Reducing the change in spacing between the interdigitated fingers 20 reduces the effective thermal coefficient of frequency (TCF) of the piezoelectric substrate 12 to improve overall frequency response of the IDTs 16 and the reflectors 18, and thus the SAW device 10, as temperature changes. At the same time, the amount of stress in the region of ultrasonic propagation on the surface of the piezoelectric substrate is increased leading to a stronger change in elastic properties, and thus, leading to favorable changes in ultrasonic velocity reflected in the temperature coefficient of velocity (TCV).

Figure 4:
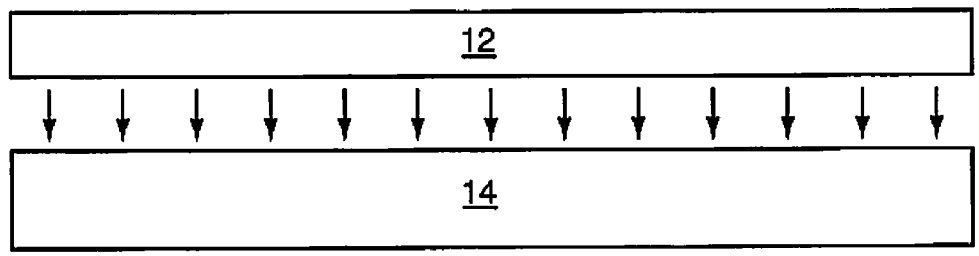
FIGS. 4-7 depict the process of manufacturing the SAW device with a piezoelectric structure having a supporting substrate between a piezoelectric substrate and a compensation layer according to one embodiment of the present invention.

With reference to FIGS. 4-7, a manufacturing process for creating the SAW device 10 is provided according to one embodiment of the present invention. Notably, the specific material characteristics provided below are merely exemplary and are not intended to limit the scope of the invention. In FIG. 4, the manufacturing process begins by providing a piezoelectric substrate 12 and a supporting substrate 14. The piezoelectric substrate 12 has a relatively high thermal coefficient of expansion (TCE) value relative to the supporting substrate 14. The isolated TCE value of the piezoelectric substrate 12 may be approximately 10 to 20 parts per million (ppm)/degree C. and the Young's Modulus value may be approximately 30 to 500 Giga Pascals (GPa). In a preferred embodiment, the isolated TCE value for the piezoelectric substrate 12 is approximately 16 to 20 ppm/degree C. and the Young's Modulus value is approximately 200 GPa. The piezoelectric substrate 12 may be any single crystal piezoelectric material, such as lithium tantalate, lithium niobate, a deposited piezoelectric thin film, such as, aluminum nitride and zinc oxide, or a piezoceramic, such as lead zirconium titanate (PZT). In a preferred embodiment, the piezoelectric substrate 12 is—lithium tantalate.

The supporting substrate 14 has a relatively low isolated TCE value with respect to the piezoelectric substrate 12 and a high Young's Modulus. For example, the isolated TCE value of the supporting substrate 14 may be approximately −10 to 10 ppm/degree C. and the Young's Modulus may be approximately 20 to 1200 Gpa, with 100 to 200 Gpa being the preferred range. In a preferred embodiment the isolated TCE value of the supporting substrate 14 is approximately less than 4 ppm/degree C. and the Young's Modulus value is approximately 140 GPa. The supporting substrate 14 may be silicon, silicon dioxide, fused silica, sapphire, ceramic alumina, ceramic glass, low TCE glass, diamond, Invar, Elinvar, Kovar, Titanium Niobium Invar, chromium, platinum, or palladium based Invar, tungsten carbide foil, chromium foil, titanium dioxide doped silica, powder filled or sol-gel based solidifying compositions, or any solid dielectric with a relatively low TCE value, and may be approximately 10 to 1000 μm in thickness. In a preferred embodiment, the supporting substrate 14 is silicon and is approximately 200 to 500 μm in thickness.

The piezoelectric substrate 12 is bonded or otherwise attached to the top surface of the supporting substrate 14. The bonding method may be organic adhesive bonding, non-organic adhesive bonding, direct bonding, metal layer bonding, metal glue bonding, or the like. As described further below in association with another embodiment, the supporting substrate 14 may also be formed on the piezoelectric substrate 12 by evaporation, chemical vapor deposition (CVD), plasma enhanced chemical vapor deposition (PECVD), sputtering, or similar deposition, growth, or electroplating process. In a preferred embodiment, the bonding method is direct bonding, because it provides more compatibility with typical integrated circuit processing, minimizes contamination, and offers long-term stability of the bond between the piezoelectric substrate 12 and the supporting substrate 14. In a preferred embodiment, the process of bonding the piezoelectric substrate 12 to the supporting substrate 14 occurs at or around room temperature.

Figure 5:
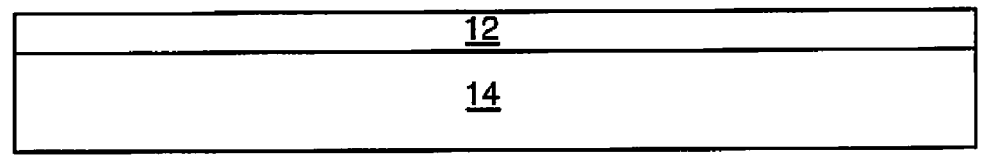

In FIG. 5, the piezoelectric substrate 12 is thinned and polished to approximately 1 to 100% of the supporting substrate's thickness. In a preferred embodiment, the piezoelectric substrate 12 is approximately 5 to 15% of the supporting substrate's thickness. Alternatively, the piezoelectric substrate 12 may be thinned and polished after the compensation layer 26 is subsequently attached to the bottom surface of the supporting substrate 14.

Figure 6:
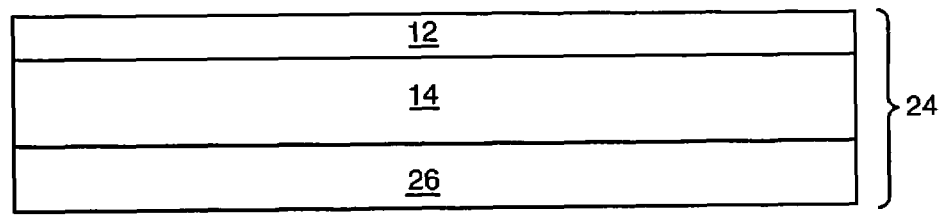

In FIG. 6, the compensation layer 26 is bonded or otherwise attached to the bottom surface of the supporting substrate 14. The compensation layer 26 has a high isolated TCE value relative to that of the supporting substrate 14. The isolated TCE values of the piezoelectric substrate 12 and the compensation layer 26 may be the same or relatively similar. The isolated TCE value of the compensation layer 26 may be approximately 10 to 20 ppm/degree C. and the Young's Modulus may be approximately 30 to 500 GPa. In a preferred embodiment, the isolated TCE value of the compensation layer 26 is approximately 16 to 20 ppm/degree C. and the Young's Modulus value is approximately 200 GPa. The compensation layer 26 may be copper, lithium tantalate, lithium niobate, steel, nickel, aluminum, bronze, any ceramic or any alloy with a relatively high isolated TCE value, or the like, and may be approximately 1 to 100% of the supporting substrate's thickness. In a preferred embodiment, the compensation layer 26 is lithium tantalate and is approximately 5 to 15% of the supporting substrate's thickness. The compensation layer 26 may be bonded to the supporting substrate 14 by organic adhesive bonding, non-organic adhesive bonding, direct bonding, glue bonding, metal layer bonding, or the like. Notably, an intermediate layer may be formed to facilitate bonding. Further, the compensation layer 26 may also be formed on the bottom surface of the supporting substrate 14 by evaporation, chemical vapor deposition (CVD), plasma enhanced chemical vapor deposition (PECVD), sputtering, or like deposition, growth, or electroplating process.

The composite structure 24, including the piezoelectric substrate 12, the supporting substrate 14, and the compensation layer 26, has an effective TCE value that is lower than the isolated TCE value of the piezoelectric substrate 12. The effective TCE value of the composite structure 24 may be approximately −10 to 16 ppm/degree C. In a preferred embodiment, the effective TCE value of the composite structure 24 is approximately 0 ppm/degree C. The corresponding effective TCF value of the composite structure 24 may be approximately −10 to 40 ppm/degree C. In a preferred embodiment, the effective TCF value of the composite structure 24 is approximately 0 ppm/degree C. The composite structure 24 may be approximately 20 to 1000 μm in thickness. In a preferred embodiment, the composite structure 24 is approximately 200 to 500 μm in thickness.

Those skilled in the art will recognize that other thicknesses, TCE values, and TCF values for the piezoelectric substrate 12, the supporting substrate 14, the compensation layer 26, and the composite structure 24 are applicable. Although the piezoelectric substrate 12, the supporting substrate 14, and the compensation layer 26 are depicted on top of one another in this example, those skilled in the art will recognize that there may be any number of layers in between those depicted without departing from the functionality or concepts of the present invention. Further, the piezoelectric substrate 12, the supporting substrate 14, and the compensation layer 26 may include one or more layers of the same or different materials.

Figure 7:
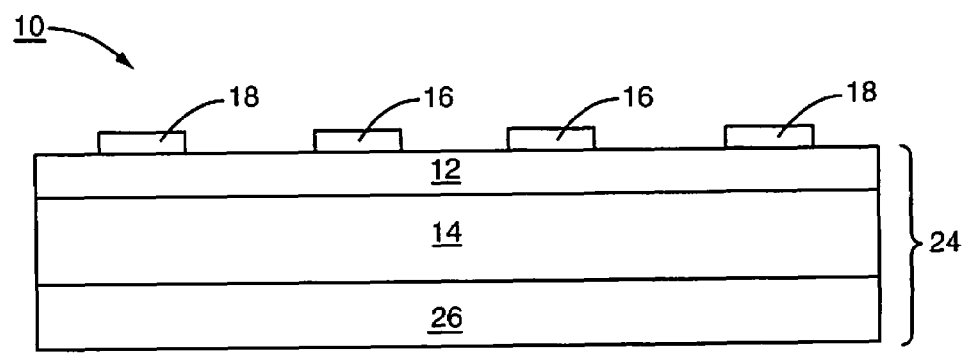

In FIG. 7, the IDTs 16 and reflectors 18 are formed on the surface of the piezoelectric substrate 12. Next, the SAW device 10 undergoes further processing, which may include wafer level packaging and the like (not shown).

Figure 8:
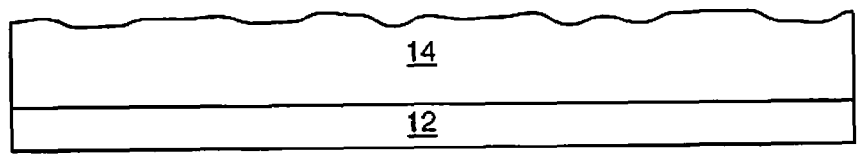
FIGS. 8-11 depict the process of manufacturing the SAW device with a piezoelectric structure having a supporting substrate between a piezoelectric substrate and a compensation layer according to a second embodiment of the present invention.

With reference to the graphical representations of FIGS. 8-11, a manufacturing process for creating the SAW device 10 is provided according to a second embodiment of the present invention. In the second embodiment, the parameters for the piezoelectric substrate 12, the supporting substrate 14, the compensation layer 26, and the composite structure 24, including TCE values, Young's Modulus values, thicknesses, and materials of composition, remain equivalent to those parameters defined for the first embodiment of the present invention. In FIG. 8, the supporting substrate 14 is initially formed on the piezoelectric substrate 12 by growing, depositing, electroplating, or otherwise forming the supporting substrate 14 onto the piezoelectric substrate 12. The surface of the supporting substrate 14 may be machined by lapping or similar methods in order to remove excessive roughness from the surface of the supporting substrate. Notably, some roughness may remain and may be beneficial for subsequent compensation layer 26 adhesion or formation.

Figure 9:
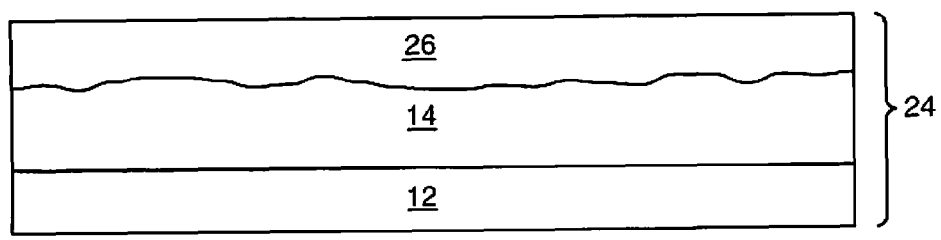
Figure 10:
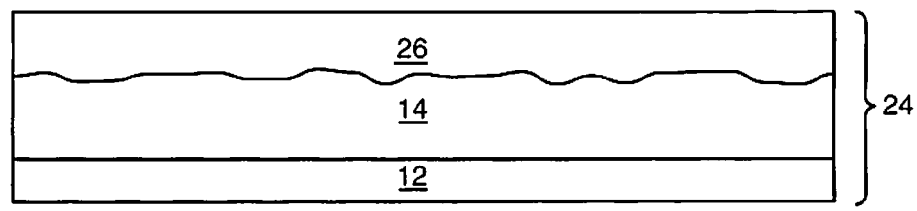
Figure 11:
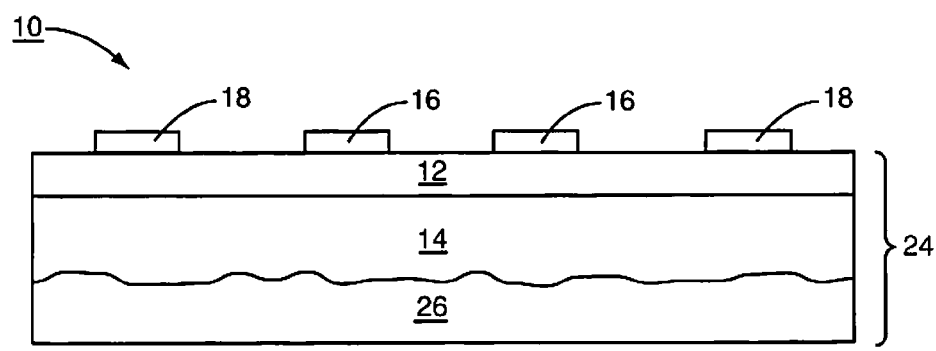

In FIG. 9, the compensation layer 26 is formed on the top surface of the supporting substrate 14 by electroplating, deposition, sputtering, evaporation, CVD, PECVD, or the like, or bonded to the supporting substrate 14 with cement, metal glue, or the like. In FIG. 10, the piezoelectric substrate 12 is thinned and polished. In FIG. 11, the composite structure 24 is inverted and the IDTs 16 and reflectors 18 are formed on the surface of the piezoelectric substrate 12.

Alternatively, prior to growing the supporting substrate 14 onto the piezoelectric substrate 12, the piezoelectric substrate 12 may be temporarily attached to a carrier. The carrier is joined to the bottom surface of the piezoelectric substrate 12 by a glue bonding method or the like, and the piezoelectric substrate 12 is then polished and thinned. The temporary carrier may be removed prior to forming the IDTs 16 and reflectors 18 on the surface of the piezoelectric substrate 12.

Figure 12:
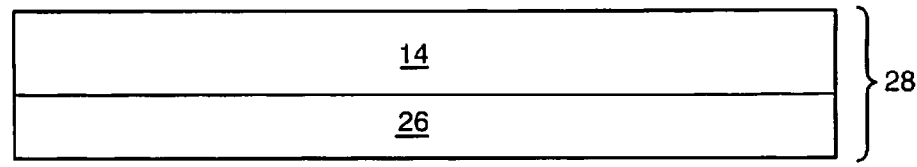
FIGS. 12-14 depict the process of manufacturing the SAW device with a piezoelectric structure having a supporting substrate between a piezoelectric substrate and a compensation layer according to a third embodiment of the present invention.
Figure 13:
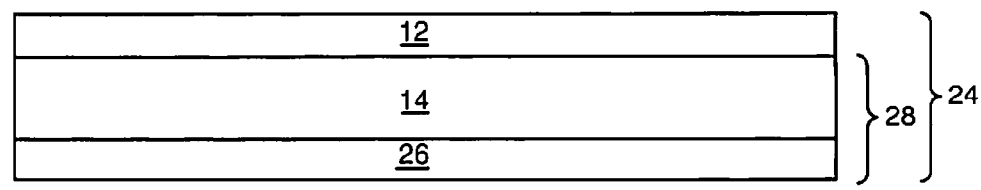
Figure 14:
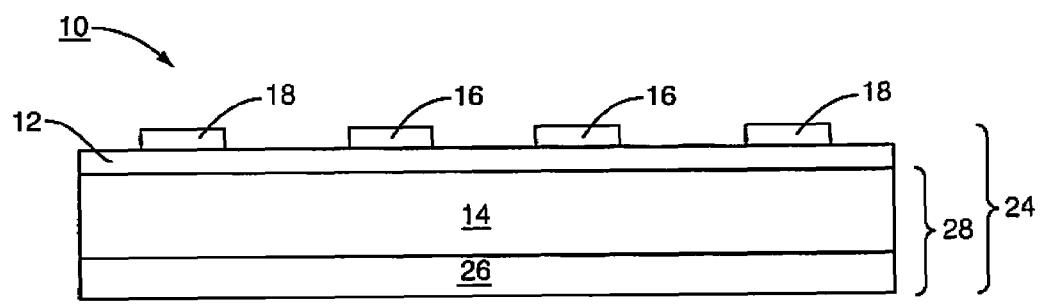

With reference to the graphical representations of FIGS. 12-14, a manufacturing process for creating the SAW device 10 is provided according to a third embodiment of the present invention. In the third embodiment, the parameters for the piezoelectric substrate 12, the supporting substrate 14, the compensation layer 26, and the composite structure 24, including TCE values, Young's Modulus values, thicknesses, and materials of composition, remain equivalent to those parameters defined for the first and second embodiment of the present invention. In FIG. 12, the supporting substrate 14 is initially bonded to or formed on the compensation layer 26 to form a compensation structure 28, which may include any number of layers, substrates, or the like. The compensation structure 28 may be formed by any of the following bonding methods. Hot or cold pressing the supporting substrate 14 and the compensation layer 26, followed by soldering and rolling the supporting substrate 14 and the compensation layer 26 together, may create the compensation structure 28. The compensation structure 28 may also be formed by electroplating the supporting substrate 14 onto the compensation layer 26 or vice versa, deposition of the supporting substrate 14 onto the compensation layer 26 by chemical or cementation method, direct bonding, glue bonding, sputtering, CVD, PECVD, or the like. In a preferred embodiment, the method for joining the supporting substrate 14 to the compensation layer 26 is direct bonding, because it provides more compatibility in typical integrated circuit processing, minimizes contamination, and offers long-term stability of the bond between the supporting substrate 14 and the compensation layer 26. In a preferred embodiment, the supporting substrate 14 may be joined to the compensation layer 26 by any hot or low temperature process. Once the supporting substrate 14 is joined to the compensation layer 26, the unbound surface of the supporting substrate 14 is flattened at approximately room temperature to promote a more effective bond with the subsequently bonded piezoelectric substrate 12.

In FIG. 13, the piezoelectric substrate 12 is joined to the compensation structure 28 on top of the supporting substrate 14 of the compensation structure 28. The piezoelectric substrate 12 may be joined to the compensation structure 28 by organic glue, inorganic glue, metal glue, direct bonding, or the like. In a preferred embodiment, the method of bonding the piezoelectric substrate 12 to the compensation structure 28 is direct bonding. In FIG. 14, the piezoelectric substrate 12 is polished and thinned and the IDTs 16 and reflectors 18 are formed on the surface of the piezoelectric substrate 12.

Those skilled in the art will recognize improvements and modifications to the preferred embodiments of the present invention. All such improvements and modifications are considered within the scope of the concepts disclosed herein and the claims that follow.

What is claimed is:

1. A composite structure comprising:
   a supporting substrate having a first isolated thermal coefficient of expansion (TCE) value, a first surface, and a second surface that is opposite the first surface;
   a piezoelectric substrate over the first surface of the supporting substrate and having a second isolated TCE value higher than the first TCE value; and
   a compensation layer over the second surface of the supporting substrate, and having a third isolated TCE value higher than the first TCE value, wherein an effective TCE value for the composite structure is less than the second TCE value.

2. The composite structure of claim 1 wherein the expansion and contraction forces in the piezoelectric substrate and the compensation layer, over changes in temperature, substantially counter one another.

3. The composite structure of claim 1 wherein an effective thermal coefficient of frequency (TCF) of the composite structure is less than an isolated TCF of the piezoelectric substrate.

4. The composite structure of claim 1 wherein the second and third isolated TCE values are substantially similar.

5. The composite structure of claim 1 wherein the effective TCE of the composite structure is an effective TCE of the piezoelectric substrate after the piezoelectric substrate is provided over the first surface of the supporting substrate and the compensation layer is provided over the second surface of the supporting substrate.

6. The composite structure of claim 1 wherein the first, second, and third isolated TCE values are respective TCE values for the supporting substrate, piezoelectric substrate, and the compensation layer in isolation from each other.

7. The composite structure of claim 1 wherein the supporting substrate is formed from at least one of a group consisting of silicon, diamond, fused silica, and alumina ceramic.

8. The composite structure of claim 1 wherein the first isolated TCE value is between about −10 and 10 ppm/degree C.

9. The composite structure of claim 1 wherein the supporting substrate has a Young's Modulus between about 20 and 1200 GPa.

10. The composite structure of claim 1 wherein the piezoelectric substrate is formed from at least one of a group consisting of single crystal piezoelectric material, deposited piezoelectric thin films, and piezoceramics.

11. The composite structure of claim 1 wherein the second isolated TCE value is between about 10 and 20 ppm/degree C.

12. The composite structure of claim 1 wherein the compensation layer is formed from at least one of a group consisting of lithium tantalate, lithium niobate, steel, nickel, copper, and aluminum.

13. The composite structure of claim 1 wherein the third isolated TCE value is between about 10 and 20 ppm/degree C.

14. The composite structure of claim 1 further comprising interdigitated transducers formed over the piezoelectric substrate.

* * * * *